United States Patent
Feichtinger et al.

(10) Patent No.: US 9,236,844 B2
(45) Date of Patent: Jan. 12, 2016

(54) CERAMIC MULTILAYER COMPONENT

(75) Inventors: Thomas Feichtinger, Graz (AT); Pascal Dotta, Eggersdorf B. Graz (AT); Hannes Schiechl, Graz (AT)

(73) Assignee: EPCOS AG, Munich (DE)

( * ) Notice: Subject to any disclaimer, the term of this patent is extended or adjusted under 35 U.S.C. 154(b) by 411 days.

(21) Appl. No.: 13/576,941

(22) PCT Filed: Feb. 9, 2011

(86) PCT No.: PCT/EP2011/051901
§ 371 (c)(1),
(2), (4) Date: Oct. 12, 2012

(87) PCT Pub. No.: WO2011/098489
PCT Pub. Date: Aug. 18, 2011

(65) Prior Publication Data
US 2013/0027155 A1    Jan. 31, 2013

(30) Foreign Application Priority Data
Feb. 10, 2010  (DE) .................. 10 2010 007 443

(51) Int. Cl.
| | |
|---|---|
| *H03H 7/01* | (2006.01) |
| *H01C 7/10* | (2006.01) |
| *H01C 7/12* | (2006.01) |
| *H01G 4/40* | (2006.01) |
| *H03H 1/00* | (2006.01) |

(52) U.S. Cl.
CPC .............. *H03H 7/0107* (2013.01); *H01C 7/10* (2013.01); *H01C 7/12* (2013.01); *H01G 4/40* (2013.01); *H03H 2001/0085* (2013.01)

(58) Field of Classification Search
CPC .................. H01G 4/40; H03H 7/0107; H03H 2001/0085; H01C 7/10; H01C 7/12
USPC ........ 333/174, 175, 185; 338/20, 21; 361/118
See application file for complete search history.

(56) References Cited

U.S. PATENT DOCUMENTS

| | | |
|---|---|---|
| 2006/0077646 A1 | 4/2006 | Ahn et al. |
| 2006/0227473 A1 | 10/2006 | Inoue et al. |
| 2009/0066462 A1 | 3/2009 | Ito et al. |
| 2009/0097219 A1 | 4/2009 | Cho et al. |
| 2011/0057747 A1 | 3/2011 | Feichtinger et al. |
| 2011/0148546 A1 | 6/2011 | Feichtinger et al. |

FOREIGN PATENT DOCUMENTS

| | | |
|---|---|---|
| DE | 102005025680 A1 | 4/2006 |
| DE | 102008019127 A1 | 10/2009 |
| JP | H113809 A | 1/1999 |
| JP | 2002222712 A | 8/2002 |
| JP | 2004172445 A | 6/2004 |
| JP | 2006245258 A | 9/2006 |
| JP | 2009099930 A | 5/2009 |
| WO | WO-2005088654 A1 | 9/2005 |

(Continued)

*Primary Examiner* — Benny Lee
*Assistant Examiner* — Jorge Salazar, Jr.
(74) *Attorney, Agent, or Firm* — McDermott Will & Emery LLP

(57) ABSTRACT

A ceramic multilayer component has a base body with connecting contacts, fitted to it, with a ferrite ceramic, which is provided for an inductive area and in which an inductance is arranged which is formed by electrical conductors, and with a varistor ceramic, wherein the varistor ceramic comprises at most 40% of the volume of the base body.

8 Claims, 3 Drawing Sheets

(56) References Cited

FOREIGN PATENT DOCUMENTS

| WO | WO 2006136359 A1 | * | 12/2006 |
| WO | 2009045008 A2 | | 4/2009 |
| WO | WO-2009127655 A1 | | 10/2009 |
| WO | 2010012661 A1 | | 2/2010 |
| WO | WO 2010012661 A1 | * | 2/2010 |

* cited by examiner

CERAMIC MULTILAYER COMPONENT

This is a U.S. national phase of application No. PCT/EP2011/051901, filed on Feb. 9, 2011. This application claims priority to DE Application No. 102010007443.8, filed Feb. 10, 2010, the entire content of which is hereby incorporated by reference herein.

The document DE 10 2005 025 680 A1 discloses a multilayer component having a varistor and an LC filter.

DE 10 2008 019 127 A1 describes a multilayer component having a ferrite ceramic which has electrode structures which form an inductance. The multilayer component furthermore has a capacitive area, which is composed of a varistor ceramic.

The object of the present invention is to specify a ceramic multilayer component for integration of an inductance and ESD protection function.

This object is achieved by the multilayer component having features as described herein.

The ceramic multilayer component has a base body with connecting contacts, fitted to it, a ferrite ceramic, which is provided for an inductive area in the base body and in which an inductance is arranged which is formed by electrical conductors, and a varistor ceramic in the base body, wherein the varistor ceramic comprises at most 40% of the volume of the base body.

In one embodiment, the varistor ceramic is arranged on an outer face of the base body.

In a further embodiment, the varistor ceramic is a stratum layer of a surface varistor, and the surface varistor comprises at most 20% of the volume of the base body.

In a further embodiment, a metallic or oxidic intermediate layer is arranged between the ferrite ceramic and the varistor ceramic. The intermediate layer may be provided as diffusion barrier, in order to suppress diffusion of dopants. For example, without an intermediate layer, dopants could diffuse out of the varistor ceramic into the ferrite ceramic, or dopants could diffuse out of the ferrite ceramic into the varistor ceramic.

In a further embodiment, the varistor ceramic is intended for an ESD protection function.

In a further embodiment, the varistor ceramic together with the connecting contacts forms a capacitance. The capacitance and the inductance may, in particular, form an LC filter.

By way of example, the ferrite ceramic may comprise an NiZn ferrite, NiCuZn ferrite, NiZnCo ferrite, NiCuZnCo ferrite or hexagonal ferrite. By way of example, the varistor ceramic may comprise a ZnO—Bi—Sb ceramic or a ZnO—Pr ceramic.

In particular, for example, the connecting contacts may be provided as a ball grid array or as a land grid array.

The arrangement of capacitive and inductive areas in the structure of the multilayer component is preferably symmetrical with respect to a layer plane. In particular, a symmetrical structure has advantages with respect to the characteristic of the filter, and furthermore has advantages for production.

The varistor ceramic has a high relative dielectric constant, as a result of which high capacitances are achieved. The use of a ferrite ceramic allows very high inductance values to be achieved, since ferrite ceramics have a comparatively high permeability, typically between 1 and 50. A ferrite ceramic with a low relative dielectric constant reduces undesirable capacitive couplings. If the varistor is arranged on an outer face of the component, the majority of the volume of the component is available for construction of the inductance, as a result of which higher inductances can be achieved than with conventional components with a comparable function, despite compact dimensions.

The combination of varistor ceramic and ferrite ceramic makes it possible to produce a multiplicity of different LC filter designs. In addition, the filter function and an ESD protection function can be integrated in one component. In this case, the ESD protection function is provided by the use of a varistor ceramic, and the filter function is provided by the use of a ferrite ceramic. In particular, it is possible to arrange a plurality of LC filters as an array in one component. For this purpose, by way of example, a plurality of LC filters are arranged alongside one another in a common component.

BRIEF DESCRIPTION OF THE DRAWINGS

The following text contains a more detailed description of examples of the multilayer component with reference to the attached figures.

DETAILED DESCRIPTION

Figure 1:
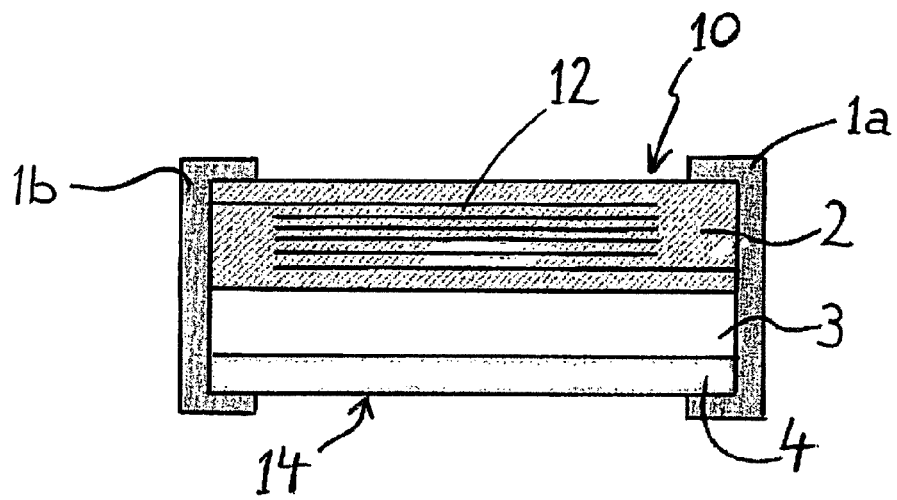
FIG. 1 shows a schematic cross section view of one embodiment of the multilayer component.

FIG. 1 shows a schematic cross section of one embodiment of the multilayer component. The multilayer component comprises an inductive area and a capacitive area in a base body 10. The inductive area is located in a ferrite ceramic 2, which contains conductor structure which form an inductance 12.

The inductance 12 can typically be formed by a conductor structure wound like a coil. The capacitive area is located in a varistor ceramic 4, which comprises at most 40% of the volume of the base body 10, and is preferably arranged on an outer face 14 of the base body 10. The capacitive area comprises a capacitance which is likewise formed by conductor structures, and which may have electrical resistance. These conductor structures may, in particular, comprise electrode stacks. The inductance and the capacitance may, in particular, form an LC filter. The multilayer component is provided with connecting contacts 1a, 1b on the outside, for connection of the conductor structures. By way of example, as is illustrated in FIG. 1, the connecting contacts 1a, 1b are arranged on end surfaces of the base body 10. An intermediate layer 3, for example composed of a dielectric, can be arranged between the ferrite ceramic 2 and the varistor ceramic 4. In particular, the intermediate layer 3 may be oxide. By way of example, oxides of magnesium, zirconium or titanium are suitable for this purpose, a mixture of which can also be used in the intermediate layer 3. Instead of this, the intermediate layer 3 may be a metallic intermediate layer.

Figure 2:
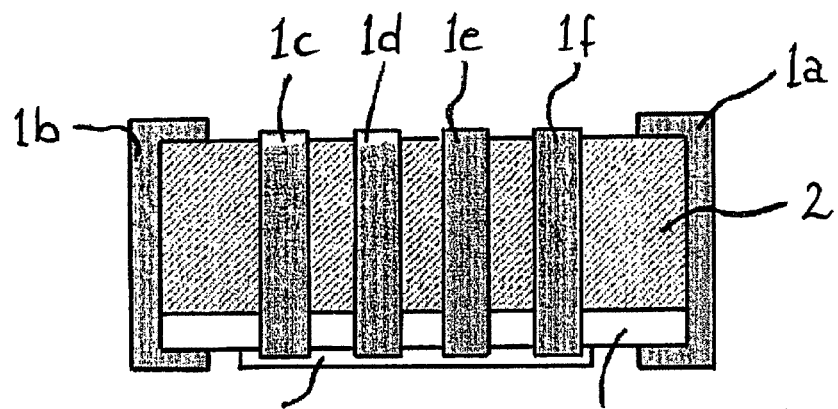
FIG. 2 shows a side view of one embodiment with a surface varistor.

FIG. 2 shows a side view of a further embodiment. In this embodiment, the base body has a surface varistor 5 composed of a varistor ceramic. The ferrite ceramic 2 makes up a considerably greater proportion of the base body than in the case of the embodiment shown in FIG. 1, and the surface varistor 5 occupies at most 20% of the volume of the base body. As in the case of the embodiment shown in FIG. 1, an intermediate layer 3 can be provided between the ferrite ceramic 2 and the surface varistor 5. Instead of this, the intermediate layer 3 may be omitted. In addition to the connecting contacts 1a, 1b provided on the end surfaces of the base body, a plurality of connecting contacts 1c, 1d, 1e, 1f, which are arranged parallel to one another and are in the form of strips, are provided on the side surfaces, for the electrical connection.

Figure 3:
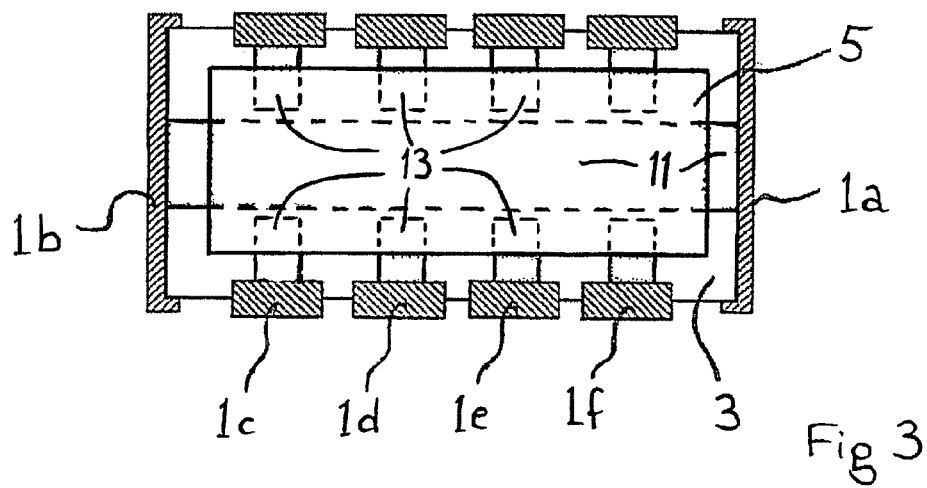
FIG. 3 shows a plan view of the embodiment shown in FIG. 2.

FIG. 3 shows a plan view of the side, provided with the surface varistor 5, of the embodiment shown in FIG. 2. FIG. 3 shows the positions of the external electrical connections. Connecting conductors 11, 13 are routed from the connecting contacts 1a, 1b, 1c, 1d, 1e, 1f to the surface varistor 5.

Figure 4:
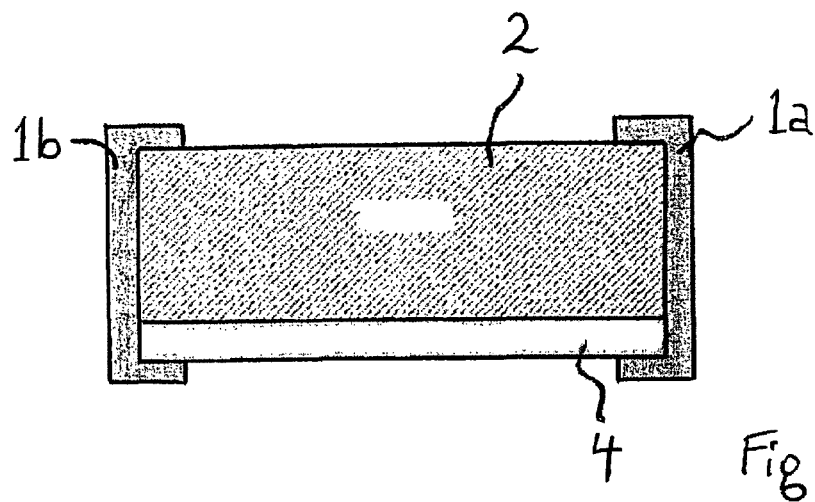
FIG. 4 shows a side view of one embodiment without an intermediate layer.

FIG. 4 shows a side view of a further embodiment, in which the intermediate layer 3 has been omitted, and the ferrite ceramic 2 and the varistor ceramic 4 are arranged adjacent to one another. In this embodiment, the varistor ceramic 4 occupies only at most 20% of the volume of the base body. This results in a large volume of the component being available for a correspondingly large inductance.

Figure 5:
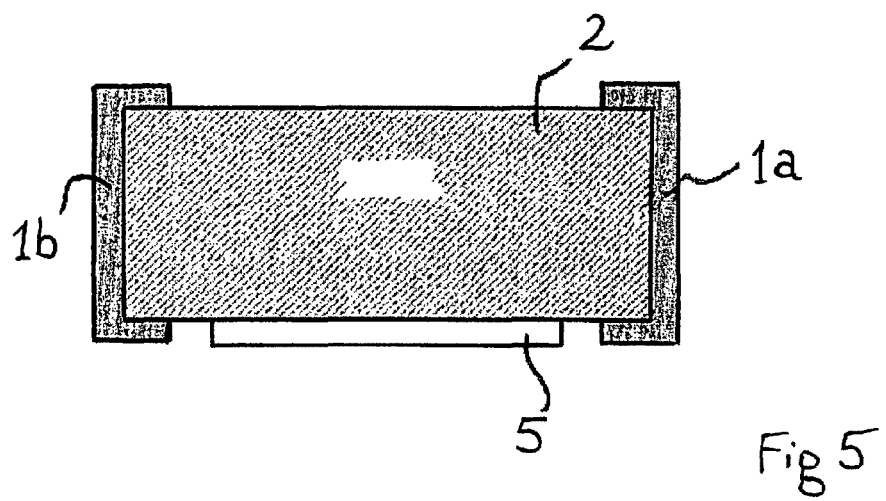
FIG. 5 shows a side view of a further embodiment with a surface varistor.

FIG. 5 shows a side view of a further embodiment, in which a surface varistor 5 is arranged on the ferrite ceramic 2 on an outer face of the base body. The base body is composed virtually exclusively of the ferrite ceramic 2. This results in an even greater volume of the component being available for a particularly large inductance, than in the case of the embodiment shown in FIG. 4.

Figure 6:
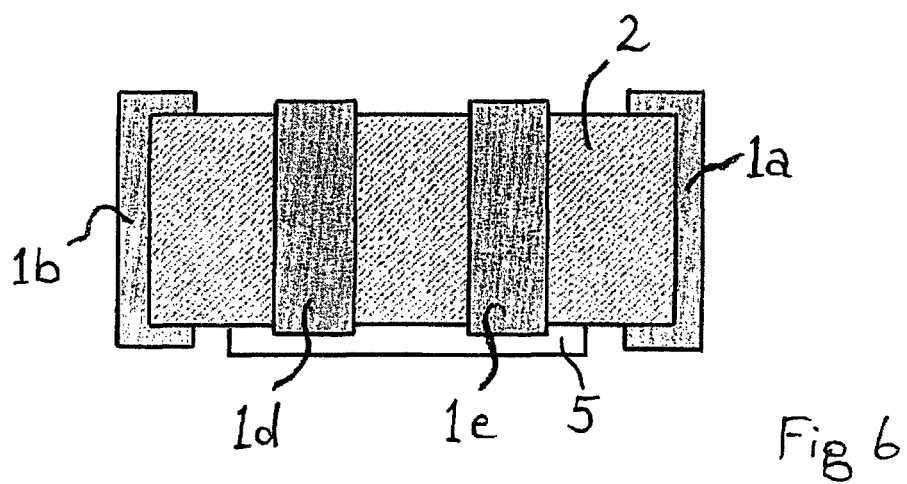
FIG. 6 shows a side view of a further embodiment with a surface varistor.

FIG. 6 shows a side view of a further embodiment, in which, as in the case of the embodiment shown in FIG. 5, a surface varistor 5 is arranged on the ferrite ceramic 2 on an outer face of the base body, and the base body is composed virtually exclusively of the ferrite ceramic 2. In addition to the connecting contacts 1a, 1b arranged on the end surfaces of the base body, there are connecting contacts 1d, 1e, which are arranged parallel to one another and are in the form of strips, on the side surfaces, for the electrical connection.

Figure 7:
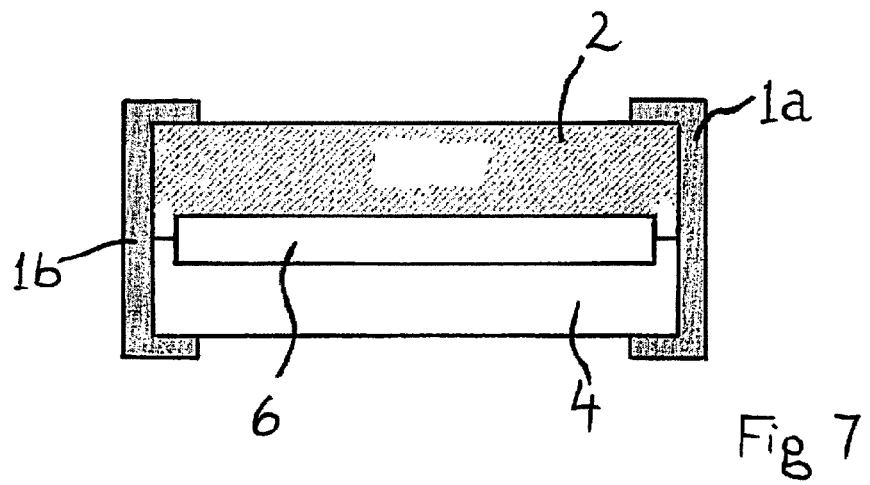
FIG. 7 shows a schematic cross section view of a further embodiment.

FIG. 7 shows a further embodiment of the multilayer component with a similar structure to that in the case of the embodiment shown in FIG. 1. A buffer layer 6 containing metal is located between the ferrite ceramic 2 with the inductive area, and the varistor ceramic 4 with the capacitive area. The buffer layer 6 acts as a diffusion barrier between the ferrite ceramic 2 and the varistor ceramic 4.

Figure 8:
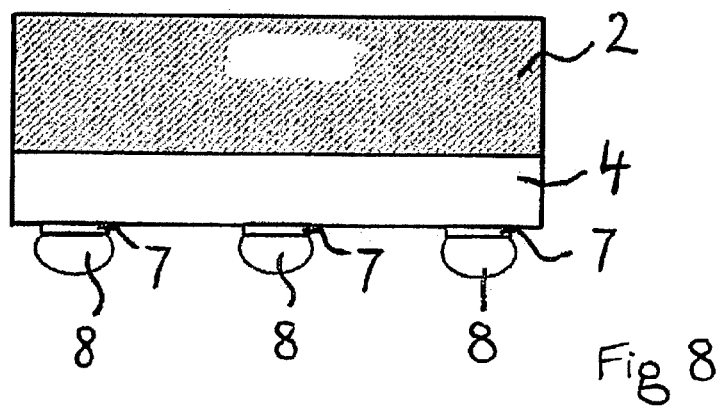
FIG. 8 shows a side view of a further embodiment with a ball grid array.

FIG. 8 shows an embodiment in which the external electrical connections are formed by a ball grid array. Connecting contacts 7 are arranged on the varistor ceramic 4, and are each provided with a ball grid array contact 8.

Figure 9:
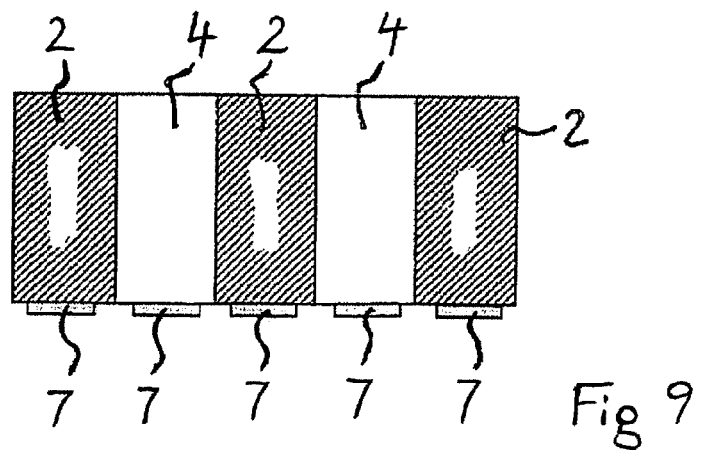
FIG. 9 shows a schematic cross section view of a further embodiment.

FIG. 9 shows an embodiment in which the external electrical connections are formed by a land grid array. A plurality of areas of ferrite ceramic 2 and varistor ceramic 4 are arranged essentially vertically in the longitudinal direction of the base body. There are connecting contacts 7 on each of these areas. In this embodiment as well, the varistor ceramic 4 comprises at most 40% of the volume of the base body, as a result of which a large volume of the component is available for the inductance in the ferrite ceramic.

The described embodiments of the ceramic multilayer component can be used in a multiplicity of circuits. By way of example, varistors can be connected between the lines on the input side and output side in an LC filter having an inductance in a first line, and having a capacitance between the first line and a second line, which is parallel to it. The varistors act as ESD protection elements for the LC filter. The LC filter may be in the form of a pi-type LC filter, in which there is in each case a capacitance between the first line and the second line on the input side and on the output side. Further embodiments may have resistors or similar electronic components on the surface of the multilayer component, and these are connected to the LC filter. In particular, this makes it possible to form RLC filters, in which the inductance and a resistor are connected in series. In this case as well, varistors are used as ESD protection elements.

LIST OF REFERENCE SYMBOLS

1a Connecting contact
1b Connecting contact
1c Connecting contact
1d Connecting contact
1e Connecting contact
1f Connecting contact
2 Ferrite ceramic
3 Intermediate layer
4 Varistor ceramic
5 Surface varistor
6 Buffer layer
7 Connecting contact
8 Ball grid array contact
10 Base body
11 Connecting conductor
12 Inductance
13 Connecting conductor
14 Outer face

The invention claimed is:

1. A ceramic multilayer component comprising:
a base body with connecting contacts, fitted to it,
a ferrite ceramic, which is provided for an inductive area in the base body and in which an inductance is arranged which is formed by electrical conductors, and
a varistor ceramic in the base body,
wherein the varistor ceramic comprises at most 40% of a volume of the base body,
wherein the varistor ceramic further includes a stratum layer of a surface varistor, and
wherein the surface varistor which makes up a part of the at most 40% of the volume of the base body comprises at most 20% of the volume of the base body.

2. The multilayer component according to claim 1, in which the varistor ceramic comprises a ZnO—Bi—Sb ceramic or a ZnO—Pr ceramic.

3. The multilayer component according to claim 1, in which the connecting contacts are provided for a ball grid array or a land grid array.

4. The multilayer component according to claim 1, in which a metallic or oxidic intermediate layer is arranged between the ferrite ceramic and the varistor ceramic.

5. The multilayer component according to claim 1, in which the varistor ceramic provides an ESD protection function.

6. The multilayer component according to claim 1, in which the varistor ceramic together with the connecting contacts forms a capacitance.

7. The multilayer component according to claim 6, in which the inductance and the capacitance form an LC filter.

8. The multilayer component according to claim 1, in which the ferrite ceramic comprises an NiZn ferrite, NiCuZn ferrite, NiZnCo ferrite, NiCuZnCo ferrite or hexagonal ferrite.

\* \* \* \* \*